(12) United States Patent
Liu et al.

(10) Patent No.: US 12,268,079 B2
(45) Date of Patent: Apr. 1, 2025

(54) DISPLAY SUBSTRATE AND MANUFACTURING METHOD THEREOF, AND DISPLAY DEVICE

(71) Applicant: BOE Technology Group Co., Ltd., Beijing (CN)

(72) Inventors: Li Liu, Beijing (CN); Junbo Wei, Beijing (CN); Pengcheng Lu, Beijing (CN); Shengji Yang, Beijing (CN); Kuanta Huang, Beijing (CN); Rongrong Shi, Beijing (CN); Yuanlan Tian, Beijing (CN); Dacheng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 412 days.

(21) Appl. No.: 17/779,784

(22) PCT Filed: Feb. 3, 2021

(86) PCT No.: PCT/CN2021/075134
§ 371 (c)(1),
(2) Date: May 25, 2022

(87) PCT Pub. No.: WO2021/155813
PCT Pub. Date: Aug. 12, 2021

(65) Prior Publication Data
US 2023/0345803 A1 Oct. 26, 2023

(30) Foreign Application Priority Data
Feb. 5, 2020 (CN) .......................... 202010080873.3

(51) Int. Cl.
*H10K 59/80* (2023.01)
*H10K 59/12* (2023.01)
(Continued)

(52) U.S. Cl.
CPC ... *H10K 59/80518* (2023.02); *H10K 59/1201* (2023.02); *H10K 59/123* (2023.02);
(Continued)

(58) Field of Classification Search
CPC ............. H10K 59/1201; H10K 59/123; H10K 59/124; H10K 59/131; H10K 59/8051;
(Continued)

(56) References Cited

U.S. PATENT DOCUMENTS 6,157,127 A 12/2000 Hosokawa et al.
2014/0103311 A1 4/2014 Sung

FOREIGN PATENT DOCUMENTS

CN 103730599 A 4/2014
CN 107507930 A 12/2017
(Continued)

OTHER PUBLICATIONS

PCT/CN2021/075134 international search report and written opinion.

*Primary Examiner* — Robert G Bachner
*Assistant Examiner* — Molly K Reida
(74) *Attorney, Agent, or Firm* — IPro, PLLC

(57) ABSTRACT

A display substrate includes: a wafer base (1) provided with a transistor; a metal reflective structure (2) on the wafer base, the metal reflective structure being electrically connected to the transistor, and being provided with a protrusion (21) protruding away from the wafer base; a first insulation layer (3) on a side of the metal reflective structure away from the wafer base, a surface of a portion of the first insulation layer corresponding to the metal reflective structure and facing away from the metal reflective structure being flush with a top face of the protrusion; and a transparent anode (4) on a side of the first insulation layer facing away from the
(Continued)

metal reflective structure, the transparent anode being in contact connection with the top face of the protrusion.

12 Claims, 3 Drawing Sheets

(51) Int. Cl.
*H10K 59/123* (2023.01)
*H10K 59/124* (2023.01)
*H10K 59/131* (2023.01)
*H10K 102/00* (2023.01)
*H10K 102/10* (2023.01)

(52) U.S. Cl.
CPC .......... *H10K 59/124* (2023.02); *H10K 59/131* (2023.02); *H10K 2102/103* (2023.02); *H10K 2102/351* (2023.02)

(58) Field of Classification Search
CPC ....... H10K 59/80516; H10K 59/80518; H10K 59/878
See application file for complete search history.

(56) References Cited

FOREIGN PATENT DOCUMENTS

CN 110718571 A 1/2020
EP 1650817 A1 * 4/2006 .......... H01L 27/3211

* cited by examiner

DISPLAY SUBSTRATE AND MANUFACTURING METHOD THEREOF, AND DISPLAY DEVICE

CROSS REFERENCE TO RELATED APPLICATIONS

The present disclosure is a national phase entry under 35 U.S.C. § 371 of International Application No. PCT/CN2021/075134, filed on Feb. 3, 2021, which claims priority to Chinese Patent Application No. 202010080873.3, filed to the China National Intellectual Property Administration on Feb. 5, 2020 and entitled "SILICON-BASED OLED DISPLAY PANEL, MANUFACTURING METHOD THEREOF, AND DISPLAY DEVICE", the entire contents of which are incorporated herein by reference.

FIELD

The present disclosure relates to the technical field of display, in particular to a display substrate and a manufacturing method thereof, and a display device.

BACKGROUND

An OLED (Organic Lighting-Emitting Diodes) display technology serves as a novel display technology, has been widely applied to the fields of smart watches, mobile phones, tablet computers, and displays, etc. Silicon-based OLED display adopts a single crystal silicon wafer as an active driving backboard, has excellent properties of high pixel density, high integration, small volume, easy carry, good anti-seismic property, ultra-low power consumption and the like, and is one of the hotspots in the field of research on the display technology at present.

SUMMARY

Embodiments of the present disclosure provide a display substrate, including:
- a wafer base, being provided with a transistor;
- a metal reflective structure on the wafer base, wherein the metal reflective structure is electrically connected to the transistor, and is provided with a protrusion protruding away from the wafer base;
- a first insulation layer on a side of the metal reflective structure facing away from the wafer base, wherein a surface of a portion, corresponding to the metal reflective structure and facing away from the metal reflective structure, of the first insulation layer is flush with a top face of the protrusion, so as to enable the top face of the protrusion to be exposed, and the top face of the protrusion is a surface of the protrusion facing away from the first insulation layer; and
- a transparent anode on a side of the first insulation layer facing away from the metal reflective structure, wherein the transparent anode is in contact connection with the top face of the protrusion.

In a possible implementation, in the display substrate provided by the embodiments of the present disclosure, in a direction perpendicular to the wafer base, a thickness of the first insulation layer is equal to a height of the protrusion.

In a possible implementation, the display substrate provided by the embodiments of the present disclosure further includes: a metal wire located on the transistor and electrically connected to the transistor, and a second insulation layer located on the metal wire.

The second insulation layer is provided with a via hole. Joint metal electrically connected to the metal wire is arranged in the via hole. In the direction perpendicular to the wafer base, a top face of the joint metal is higher than a surface of a side of the second insulation layer facing away from the metal wire. The top face of the joint metal is a surface of the joint metal facing away from the metal wire.

The metal reflective structure is located on a side of the second insulation layer facing away from the metal wire. The metal reflective structure is electrically connected to the metal wire through the joint metal, and the protrusion of the metal reflective structure is opposite to the joint metal.

In a possible implementation, in the display substrate provided by the embodiments of the present disclosure, the joint metal includes tungsten.

In a possible implementation, in the display substrate provided by the embodiments of the present disclosure, the transparent anode includes ITO.

In a possible implementation, in the display substrate provided by the embodiments of the present disclosure, the metal reflective structure includes a first metal layer, an aluminum metal layer and a titanium nitride layer which are laminated in sequence, and the aluminum metal layer is located on a side of the first metal layer facing away from the first insulation layer.

The first metal layer is a metal titanium layer or is of a double-layer structure of a metal titanium layer and a titanium nitride layer which are arranged in a laminated mode.

In a possible implementation, in the display substrate provided by the embodiments of the present disclosure, the metal wire includes a second metal layer, a metal aluminum layer and a third metal layer which are laminated in sequence, and the metal aluminum layer is positioned on a side of the second metal layer facing away from the transistor.

The second metal layer includes a metal titanium layer, a titanium nitride layer or a double-layer structure of a metal titanium layer and a titanium nitride layer; and the third metal layer includes a metal titanium layer, a titanium nitride layer, or a double-layer structure of a metal titanium layer and a titanium nitride layer.

In a possible implementation, the display substrate provided by the embodiments of the present disclosure further includes an organic light-emitting device and a transparent cathode which are located on the transparent anode in sequence.

In another aspect, embodiments of the present disclosure further provide a manufacturing method of the display substrate, including:
- providing a wafer base, and forming a transistor on the wafer base;
- forming a patterned metal reflective structure on the wafer base, wherein the metal reflective structure is electrically connected to the transistor, and the metal reflective structure is provided with a protrusion protruding away from the wafer base;
- forming a first insulation layer on a side of the metal reflective structure facing away from the wafer base, and processing the first insulation layer through a patterning process, so as to enable a surface of a portion, corresponding to the metal reflective structure and facing away from the metal reflective structure, of the first insulation layer to be flush with a top face of the protrusion and expose the top face of the protrusion, wherein the top face of the protrusion is a surface of the protrusion facing away from the first insulation layer; and forming a patterned transparent anode on a side of the first insulation layer facing away from the metal reflective structure, wherein the transparent anode is in contact connection with the top face of the protrusion.

In a possible implementation, in the manufacturing method provided by the embodiments of the present disclosure, in a direction perpendicular to the wafer base, a thickness of the first insulation layer is equal to a height of the protrusion.

The processing the first insulation layer through the patterning process, includes:

only removing a portion of the first insulation layer on the top face of the protrusion through the patterning process.

In a possible implementation, after forming the transistor on the wafer base, the manufacturing method provided by the embodiments of the present disclosure further includes:

forming a patterned metal wire electrically connected to the transistor on a side of the transistor facing away from the wafer base;

forming a second insulation layer on a side of the metal wire facing away from the wafer base, forming a via hole in the second insulation layer, and forming joint metal in the via hole; and processing surfaces of the second insulation layer and the joint metal by adopting a chemical mechanical polishing method to obtain that a top face of the joint metal is higher than a surface of a side of the second insulation layer facing away from the metal wire.

In another aspect, embodiments of the present disclosure further provide a display device, including any of the above display substrates.

DETAILED DESCRIPTION OF THE EMBODIMENTS

In a related silicon-based OLED structure, a metal wire is arranged on a top layer of a wafer on a silicon-based substrate. An anode structure is arranged on the metal wire. An insulation layer is arranged between the metal wire and the anode structure. The metal wire is connected with the anode structure through a connection via hole. Joint metal is arranged in the connection via hole.

In the process of manufacturing and processing, since a polishing rate of chemical mechanical polishing on an insulation layer is different from that on the joint metal. The polishing rate on the insulation layer is higher than the polishing rate on the joint metal, causing that the joint metal is generally protruded and higher than a surface of the insulation layer. The anode structure includes a metal reflective layer and a transparent anode layer, electrically connected to the metal reflective layer, which are laminated on the insulation layer in sequence. The joint metal is generally protruded and higher than the surface of the insulation layer, so that each film layer structure in the subsequent anode structure forms a protrusion at a portion corresponding to the joint metal, that is, a problem of unflatness caused by protruding of the joint metal may be transferred to the transparent anode layer, so as to cause unflatness of the transparent anode layer.

In the related art, generally a method to solve the problem is to arrange the joint metal at an edge position of a pixel region, and an unflatness region is covered with a pixel definition layer (PDL), but the solution may cause increasing of processing steps, and meanwhile, the solution may also cause decreasing of light-emitting areas. Thus, a problem of how to solve unflatness of the transparent anode layer caused by protruding of the joint metal is an urgent problem to be solved at present.

The technical solutions in the embodiments of the present disclosure will be described clearly and completely with reference to accompanying drawings of the embodiments of the present disclosure. It is apparent that the described embodiments are part of, rather than all of, embodiments of the present disclosure. Based on the described embodiments of the present disclosure, all other embodiments obtained by those ordinarily skilled in the art without creative labor fall within the protection scope of the present disclosure.

Figure 1:
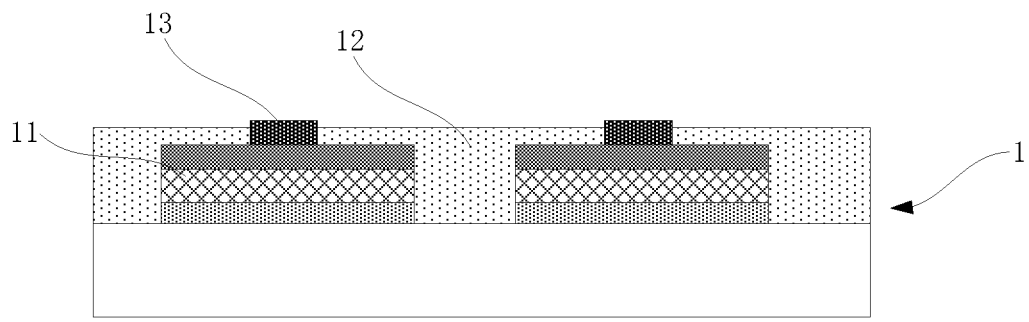
FIG. 1-FIG. 4 are respectively schematic diagrams of variation of each film layer in a manufacturing process of a display substrate provided by an embodiment of the present disclosure.
Figure 2:
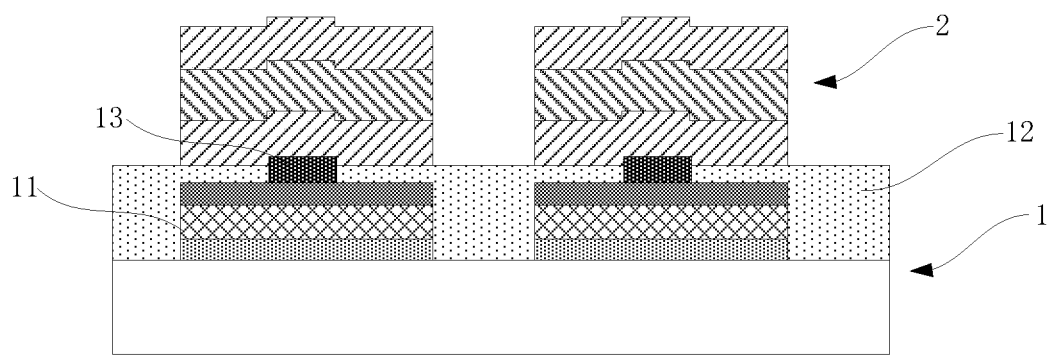
Figure 3:
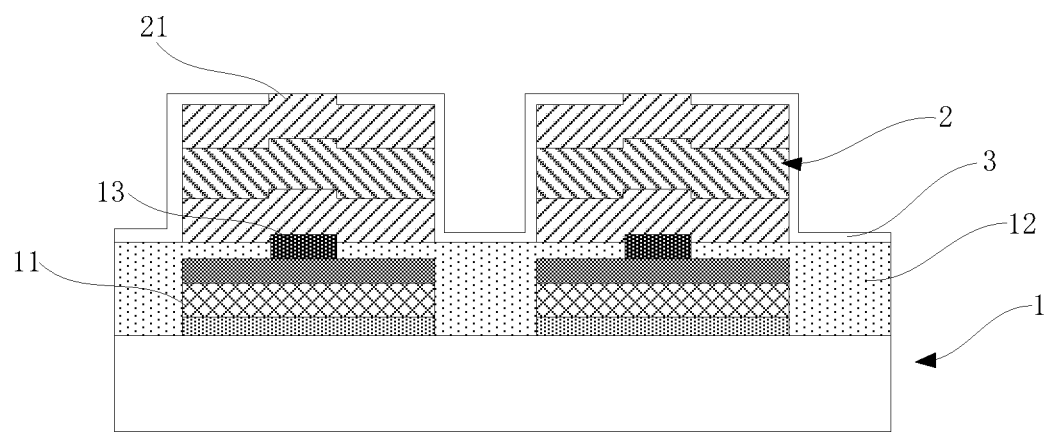
Figure 4:
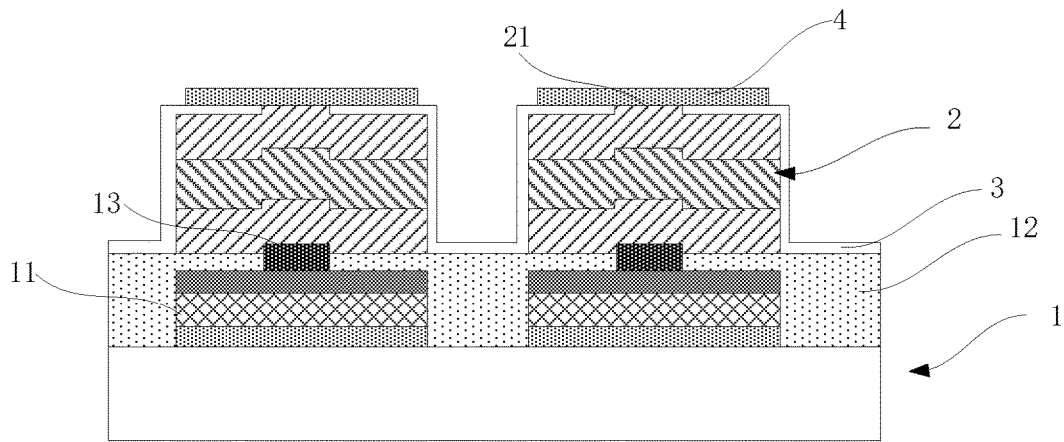

FIG. 4 is a schematic structural diagram of a local film layer of a display substrate provided by an embodiment of the present disclosure, referring to FIG. 4, the display substrate provided by embodiments of the present disclosure, includes:

a wafer base 1, provided with a transistor;

a metal reflective structure 2 on the wafer base 1, and electrically connected to the transistor: the metal reflective structure 2 being provided with a protrusion 21 protruding away from the wafer base 1;

a first insulation layer 3 on a side of the metal reflective structure 2 facing away from the wafer base 1; a surface of a portion, corresponding to the metal reflective structure 2 and facing away from the metal reflective structure 2, of the first insulation layer 3 being flush with a top face of the protrusion 21, so as to enable the top face of the protrusion 21 to be exposed, and the top face of the protrusion 21 being a surface of the protrusion 21 facing away from the first insulation layer 3; and a transparent anode 4 on a side of the first insulation layer 3 facing away from the metal reflective structure 2, the transparent anode 4 is in contact connection with the top surface of the protrusion 21.

In the display substrate provided by the embodiments of the present disclosure, the wafer base may be divided into a plurality of sub-pixel units, and each sub-pixel unit is provided with a transistor. For convenient illustration, a direction perpendicular to the wafer base is taken as a vertical direction, a side where the transistor is arranged on the wafer base is a top side (or an upper side) of the wafer base, and a light-emitting unit is further arranged on the side, where the transistor is arranged, of the wafer base. The light-emitting unit includes a metal reflective structure, electrically connected to the transistor, arranged on the side the wafer base where the transistor is arranged. A side of the metal reflective structure facing away from the wafer base is provided with a protrusion. A first insulation layer is formed on the metal reflective structure. An upper surface of a portion of the first insulation layer corresponding to the metal reflective structure is flush with the top face of the protrusion. The top face of the protrusion is exposed, so that a surface of a portion, corresponding to the metal reflective structure, in the first insulation layer and the top face of the protrusion form a flat surface. When the transparent anode is arranged on the first insulation layer, the transparent anode is directly arranged on the first insulation layer and is directly in contact connection with the top face of the protrusion, so that the transparent anode can form a flat transparent anode, the problem of unflatness caused by the effect of the protrusion in the metal reflective structure can be avoided, and the problem of decreasing of light-emitting areas caused by unflatness of the transparent anode in the related art is solved.

That is, in the display substrate, the surface of the first insulation layer corresponding to the metal reflective structure on the metal reflective structure is flush with the top face of the protrusion to form the flat surface, so that the transparent anode arranged on the first insulation layer can be not affected by the protrusion, the transparent anode is relatively flat, the film layer is simple in structure, manufacturing technological processes cannot be increased, and it is beneficial to ensure that the light-emitting areas of the light-emitting units cannot be decreased.

Optionally, in the display substrate provided by the embodiments of the present disclosure, as shown in FIG. 4, in a direction perpendicular to the wafer base 1, a thickness of the first insulation layer 3 is equal to a height of the protrusion 21.

When the first insulation layer is arranged, in order to enable the thickness of the first insulation layer to be equal to the height of the protrusion, during manufacturing, only a portion of the first insulation layer coated on the top face of the protrusion is removed, so as to enable the surface of the first insulation layer to be flush with the top face of the protrusion. The flat surface is obtained before the transparent anode is arranged, the manufacturing process is simple, it is beneficial to ensure that the surface flatness of the first insulation layer is good, and then it is beneficial to ensure that the flatness of the transparent anode is good.

Optionally, in the display substrate provided by the embodiments of the present disclosure, the structure of the wafer base 1 may be divided into the plurality of sub-pixel units. A top side of the wafer base 1 is provided with the metal wire 11 positioned on the transistor of each sub-pixel unit and electrically connected to the transistor, and the second insulation layer 12 positioned on the metal wire 11.

The second insulation layer 12 is provided with the via hole, the joint metal 13 electrically connected to the metal wire 11 is arranged in the via hole. As a necessary process of the manufacturing process, in the manufacturing process, chemical and physical polishing processing may be carried out on surfaces of the second insulation layer 12 and the joint metal 13, so as to cause that in the direction perpendicular to the wafer base, the top face of the joint metal 13 is higher than a surface of a side of the second insulation layer 12 facing away from the metal wire 11. The metal reflective structure 2 is arranged on the second insulation layer 12. The metal reflective structure 2 is electrically connected to the joint metal 13, and the portion of the metal reflective structure 2 corresponding to the joint metal 13 forms the protrusion.

The above metal wire 11 may include a second metal layer, a metal aluminum layer and a third metal layer which are arranged in a laminated mode. The metal aluminum layer is positioned on a side of the second metal layer facing away from the transistor. The second metal layer may be a metal titanium layer, or a titanium nitride layer, or a double-layer structure of the metal titanium layer and the titanium nitride layer. The third metal layer may be a metal titanium layer, a titanium nitride layer, or a double-layer structure of the metal titanium layer and the titanium nitride layer.

Optionally, in the display substrate provided by the embodiments of the present disclosure, the joint metal 13 may be tungsten, or other metal, which is not limited in the embodiments. Moreover, the transparent anode 4 may be ITO. The first insulation layer 3 may be silicon oxide, and the second insulation layer 12 may be silicon oxide.

In the display substrate provided by the embodiments of the present disclosure, aiming at the structure arrangement of the metal reflective structure 2, the metal reflective structure 2 may be a first metal layer, an aluminum metal layer and a titanium nitride layer which are laminated in sequence, and the aluminum metal layer is positioned on a side of the first metal layer facing away from the first insulation layer. The first metal layer may be a metal titanium layer, or, the first metal layer may also be a double-layer structure of the metal titanium layer and the titanium nitride layer which are arranged in a laminated mode. The metal reflective structure 2 is arranged to be of a multilayer metal structure, which is beneficial to enhance electrical conductivity and light reflecting property of the metal reflective structure 2.

In the display substrate provided by the embodiments of the present disclosure, the light-emitting unit may further include an organic light-emitting device and a transparent cathode which are positioned on the transparent anode in sequence, so as to enable the display substrate to realize to a light-emitting function.

Based on the same inventive concept, embodiments of the present disclosure further provide a display device, including the above display substrate provided by the embodiments of the invention. The display device may be a mobile phone, a tablet computer, a television, a display, a notebook computer, a digital photo frame, a navigator and other products or components having a display function. The implementation of the display device may refer to the embodiments of the above display substrate, which will not be repeated here.

Figure 5:
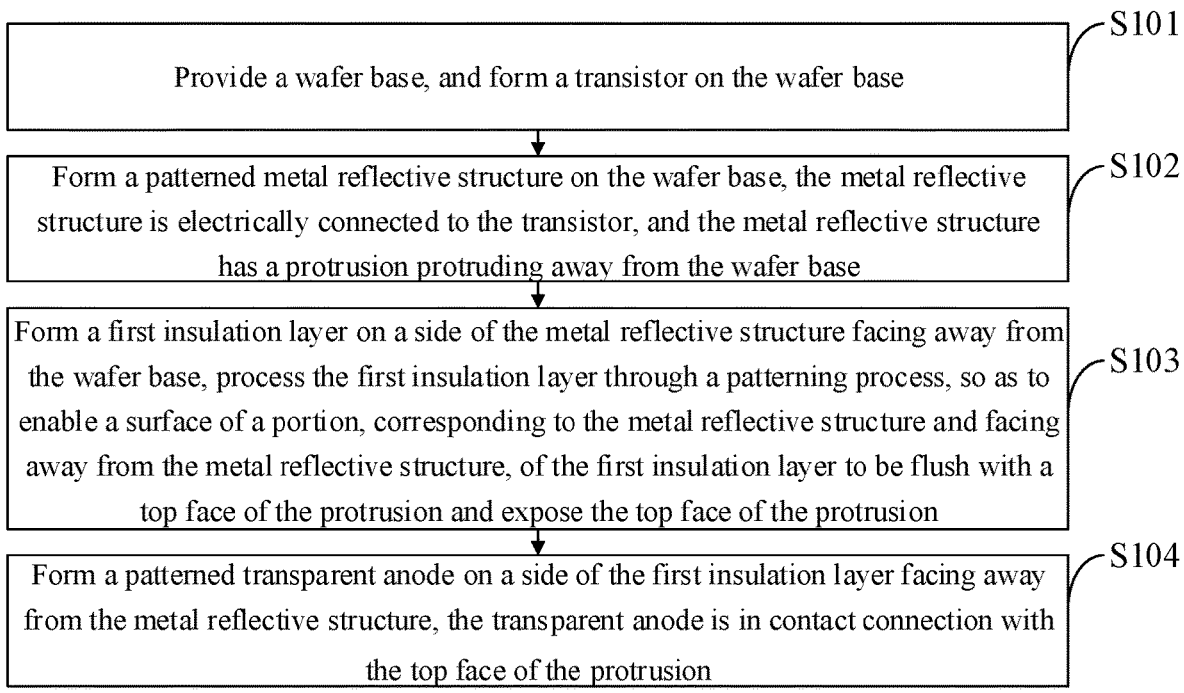
FIG. 5 and FIG. 6 are respectively flow diagrams of a manufacturing method of a display substrate provided by an embodiment of the present disclosure.

Based on the same inventive concept, in junction with FIG. 1, FIG. 2, FIG. 3 and FIG. 4, as shown in FIG. 5, embodiments of the present disclosure further provide a manufacturing method of the display substrate, including the following steps.

Step S101, a wafer base 1 is provided, and a transistor is formed on the wafer base 1.

Step S102, a patterned metal reflective structure 2 is formed on the wafer base 1, the metal reflective structure 2 is electrically connected to the transistor, and the metal reflective structure 2 has a protrusion 21 protruding away from the wafer base 1.

Step S103, a first insulation layer 3 is formed on a side of the metal reflective structure 2 facing away from the wafer base 1, the first insulation layer 3 is processed through a patterning process, so that a surface of a portion, corresponding to the metal reflective structure 2 and facing away from the metal reflective structure, of the first insulation layer 3 is flush with a top face of the protrusion 21, and the top face of the protrusion 21 is exposed.

Step S104, a patterned transparent anode 4 is formed on a side of the first insulation layer 3 facing away from the metal reflective structure 2, and the transparent anode 4 is in contact connection with the top face of the protrusion 21.

In step S103, when the first insulation layer is formed, in a direction perpendicular to the wafer base, a thickness of the first insulation layer is equal to a height of the protrusion. When the first insulation layer is exposed and corroded through the patterning process, only a portion of the first insulation layer on the top face of the protrusion is removed, that is, an upper surface of the first insulation layer may be flush with the top face of the protrusion, and a flat surface is obtained before the transparent anode is formed.

Figure 6:
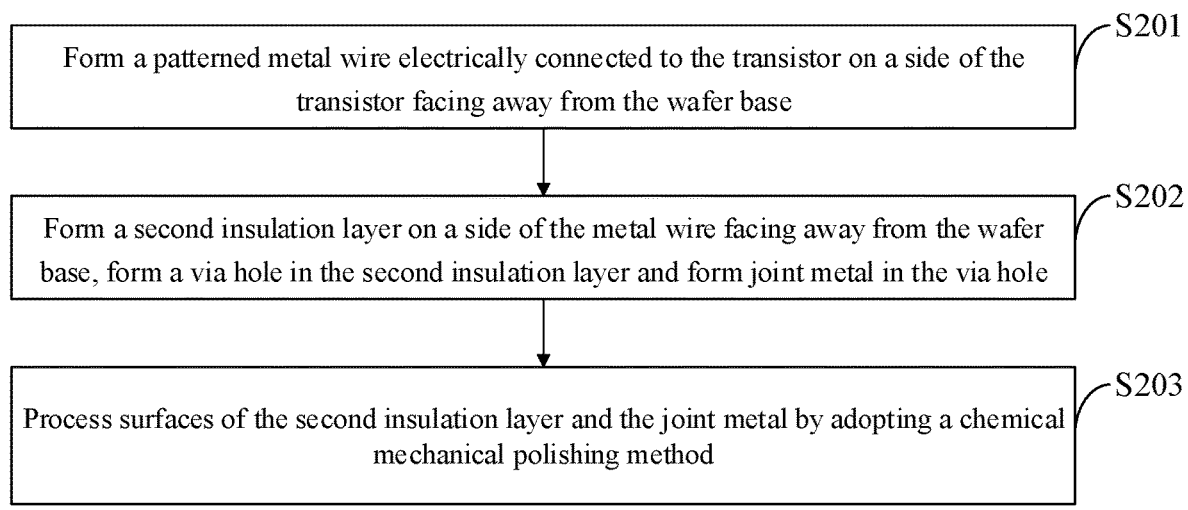

In step S101, after the transistor is formed on the wafer base 1, as shown in FIG. 6, the manufacturing method may further include the following steps.

Step S201, a patterned metal wire electrically connected to the transistor is formed on a side of the transistor facing away from the wafer base.

Step S202, a second insulation layer is formed on a side of the metal wire facing away from the wafer base, a via hole is formed in the second insulation layer, and joint metal is formed in the via hole.

Step S203, surfaces of the second insulation layer and the joint metal are processed by adopting a chemical mechanical polishing method, since a polishing rate on the second insulation layer is different from a polishing rate on the joint metal, i.e., the polishing rate on the second insulation layer is greater than the polishing rate on the joint metal, after polishing, the top face of the joint metal will be higher than the surface of the second insulation layer, that is, the joint metal will be protruded from the surface of the second insulation layer, then it may cause that a protrusion is formed on a portion of the metal reflective structure manufactured subsequently corresponding to the joint metal.

The manufacturing method of the above display substrate provided by the embodiments of the present disclosure may further include that an organic light-emitting device and a transparent cathode are formed on the transparent anode in sequence, so that the display substrate realizes a light-emitting function.

It will be apparent to those skilled in the art that various modifications and variations can be made in the present disclosure without departing from the spirit or scope of the present disclosure. Thus, it is intended that the present disclosure cover the modifications and variations of the present disclosure provided they come within the scope of the appended claims of the present disclosure and their equivalents.

What is claimed is:

1. A display substrate, comprising:
    a wafer base, provided with a transistor;
    a metal reflective structure on the wafer base, wherein the metal reflective structure is electrically connected to the transistor, and is provided with a protrusion protruding away from the wafer base;
    a first insulation layer on a side of the metal reflective structure facing away from the wafer base, wherein a surface of a portion, corresponding to the metal reflective structure and facing away from the metal reflective structure, of the first insulation layer is flush with a top face of the protrusion, so as to enable the top face of the protrusion to be exposed, and the top face of the protrusion is a surface of the protrusion facing away from the first insulation layer; and
    a transparent anode on a side of the first insulation layer facing away from the metal reflective structure, wherein the transparent anode is in contact connection with the top face of the protrusion.

2. The display substrate according to claim 1, wherein in a direction perpendicular to the wafer base, a thickness of the first insulation layer is equal to a height of the protrusion.

3. The display substrate according to claim 1, further comprising:
    a metal wire located on the transistor and electrically connected to the transistor; and
    a second insulation layer on the metal wire; wherein
    the second insulation layer is provided with a via hole, joint metal electrically connected to the metal wire is arranged in the via hole, in a direction perpendicular to the wafer base, a top face of the joint metal is higher than a surface of a side of the second insulation layer facing away from the metal wire, and the top face of the joint metal is a surface of the joint metal facing away from the metal wire; and
    the metal reflective structure is located on a side of the second insulation layer facing away from the metal wire, the metal reflective structure is electrically connected to the metal wire through the joint metal, and a protrusion of the metal reflective structure is opposite to the joint metal.

4. The display substrate according to claim 3, wherein the joint metal comprises tungsten.

5. The display substrate according to claim 3, wherein the metal wire comprises a second metal layer, a metal aluminum layer and a third metal layer which are laminated in sequence, and the metal aluminum layer is located on a side of the second metal layer facing away from the transistor;
    the second metal layer comprises a metal titanium layer, a titanium nitride layer, or a double-layer structure of a metal titanium layer and a titanium nitride layer; and
    the third metal layer comprises a metal titanium layer, a titanium nitride layer, or a double-layer structure of a metal titanium layer and a titanium nitride layer.

6. The display substrate according to claim 1, wherein the transparent anode comprises ITO.

7. The display substrate according to claim 1, wherein the metal reflective structure comprises a first metal layer, an aluminum metal layer and a titanium nitride layer which are laminated in sequence, and the aluminum metal layer is located on a side of the first metal layer facing away from the first insulation layer; and
    the first metal layer is a metal titanium layer or a double-layer structure of a metal titanium layer and a titanium nitride layer which are arranged in a laminated mode.

8. The display substrate according to claim 1, further comprising:
    an organic light-emitting device and a transparent cathode which are located on the transparent anode in sequence.

9. A display device, comprising the display substrate according to claim 1.

10. A manufacturing method of the display substrate, comprising:
    providing a wafer base, and forming a transistor on the wafer base;
    patterning a metal reflective structure on the wafer base, wherein the metal reflective structure is electrically connected to the transistor, and is provided with a protrusion protruding away from the wafer base;
    forming a first insulation layer on a side of the metal reflective structure facing away from the wafer base, and processing the first insulation layer through a patterning process, so as to enable a surface of a portion, corresponding to the metal reflective structure and facing away from the metal reflective structure, of the first insulation layer to be flush with a top face of the protrusion and expose the top face of the protrusion, wherein the top face of the protrusion is a surface of the protrusion facing away from the first insulation layer; and patterning a transparent anode on a side of the first insulation layer facing away from the metal reflective structure, wherein the transparent anode is in contact connection with the top face of the protrusion.

11. The manufacturing method according to claim 10, wherein, in a direction perpendicular to the wafer base, a thickness of the first insulation layer is equal to a height of the protrusion; and
  said processing the first insulation layer through the patterning process, comprises:
    only removing a portion of the first insulation layer on the top face of the protrusion through the patterning process.

12. The manufacturing method according to claim 10, wherein after forming the transistor on the wafer base, the method further comprises:
  patterning a metal wire electrically connected to the transistor on a side of the transistor facing away from the wafer base;
  forming a second insulation layer on a side of the metal wire facing away from the wafer base, forming a via hole in the second insulation layer, and forming joint metal in the via hole; and
  processing surfaces of the second insulation layer and the joint metal by adopting a chemical mechanical polishing method to obtain that the top face of the joint metal is higher than a surface of a side of the second insulation layer facing away from the metal wire.

* * * * *